(12) United States Patent
Li et al.

(10) Patent No.: US 11,296,301 B2
(45) Date of Patent: Apr. 5, 2022

(54) DISPLAY SCREEN AND METHOD OF MANUFACTURING THEREOF

(71) Applicants: Yungu (Gu' an) Technology Co., Ltd., Langfang (CN); KUNSHAN GO-VISIONOX OPTO-ELECTRONICS CO., LTD., Kunshan (CN)

(72) Inventors: Yao Li, Kunshan (CN); Chuang Chen, Kunshan (CN); Weijie Gu, Kunshan (CN); Fengzhi Yu, Kunshan (CN); Jin Li, Kunshan (CN); Min Zou, Kunshan (CN); Xiaoxu Hu, Kunshan (CN)

(73) Assignees: YUNGU (GU'AN) TECHNOLOGY CO., LTD., Langfang (CN); KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 520 days.

(21) Appl. No.: 16/340,694

(22) PCT Filed: Jan. 11, 2019

(86) PCT No.: PCT/CN2019/071467
§ 371 (c)(1),
(2) Date: Apr. 10, 2019

(87) PCT Pub. No.: WO2019/214284
PCT Pub. Date: Nov. 14, 2019

(65) Prior Publication Data
US 2021/0367199 A1 Nov. 25, 2021

(30) Foreign Application Priority Data

May 11, 2018 (CN) .......................... 201820706216.3
May 14, 2018 (CN) .......................... 201810453312.6
May 14, 2018 (CN) .......................... 201810456852.X

(51) Int. Cl.
H01L 51/52 (2006.01)
H01L 51/00 (2006.01)
(Continued)

(52) U.S. Cl.
CPC ...... *H01L 51/5253* (2013.01); *H01L 51/0097* (2013.01); *H01L 51/56* (2013.01);
(Continued)

(58) Field of Classification Search
None
See application file for complete search history.

(56) References Cited

U.S. PATENT DOCUMENTS 7,671,532 B2 * 3/2010 Kim .................... H01L 51/5253
313/509
7,781,965 B2 8/2010 Kwon
(Continued)

FOREIGN PATENT DOCUMENTS

CN 1710999 A 12/2005
CN 101989613 A 3/2011
(Continued)

OTHER PUBLICATIONS

CN Second Office Action with Search Report dated Nov. 7, 2019 in the corresponding CN application (application No. 201810456852.X).
(Continued)

Primary Examiner — J. E. Schoenholtz
(74) Attorney, Agent, or Firm — Kilpatrick Townsend & Stockton

(57) ABSTRACT

The present disclosure relates to display screens and manufacturing methods of display screens. The display screen includes a packaged component, a non-display area includ-
(Continued)

ing an effective package area adjacent to the packaged component, and a package shadow area located at a periphery of the effective package area. The package shadow area includes a supporting substrate defining a groove for disconnecting a thin film package structure formed on the support substrate. The thin film package structure is disconnected at the groove.

20 Claims, 7 Drawing Sheets

(51) Int. Cl.
  *H01L 51/56* (2006.01)
  *H01L 27/32* (2006.01)
(52) U.S. Cl.
  CPC .... *H01L 27/3244* (2013.01); *H01L 2251/558* (2013.01); *H01L 2251/566* (2013.01)

(56) References Cited

U.S. PATENT DOCUMENTS

| | | | |
|---|---|---|---|
| 11,049,927 B2* | 6/2021 | Kim | H01L 27/3276 |
| 2005/0285522 A1 | 12/2005 | Han et al. | |
| 2006/0087229 A1* | 4/2006 | Kim | H01L 51/5253 313/509 |
| 2014/0131683 A1* | 5/2014 | Kim | H01L 51/5253 257/40 |
| 2017/0148856 A1 | 5/2017 | Choi et al. | |
| 2017/0170415 A1 | 6/2017 | Yu et al. | |
| 2018/0061910 A1 | 3/2018 | Cai | |
| 2021/0074951 A1* | 3/2021 | Kajimoto | H01L 51/56 |

FOREIGN PATENT DOCUMENTS

| | | |
|---|---|---|
| CN | 105226186 A | 1/2016 |
| CN | 105374947 A | 3/2016 |
| CN | 103486480 B | 5/2016 |
| CN | 106527792 A | 3/2017 |
| CN | 106653777 A | 5/2017 |
| CN | 106653818 A | 5/2017 |
| CN | 106887523 A | 6/2017 |
| CN | 107068715 A | 8/2017 |
| CN | 107170788 A | 9/2017 |
| CN | 107180923 A | 9/2017 |
| CN | 107238960 A | 10/2017 |
| CN | 107452894 A | 12/2017 |
| CN | 107507931 A | 12/2017 |
| CN | 107579471 A | 1/2018 |
| CN | 206849868 U | 1/2018 |
| CN | 107678196 A | 2/2018 |
| CN | 107919364 A | 4/2018 |
| CN | 108417733 A | 8/2018 |
| CN | 108649141 A | 10/2018 |
| CN | 208142229 U | 11/2018 |
| JP | 2006004909 A | 1/2006 |
| WO | 2017113256 A1 | 7/2017 |

OTHER PUBLICATIONS

CN Second Office Action dated Nov. 4, 2019 in the corresponding CN application(application No. 201810453312.6).
CN First Office Action dated Mar. 19, 2019 in the corresponding CN application (application No. 201810456852.X).
CN First Office Action dated Apr. 2, 2019 in the corresponding CN application (application No. 201810453312.6).

* cited by examiner

DISPLAY SCREEN AND METHOD OF MANUFACTURING THEREOF

CROSS-REFERENCE TO RELATED APPLICATIONS

This application is a U.S. national Stage of International Application No. PCT/CN2019/071467, filed on Jan. 11, 2019, designating the United States, which claims priority to Chinese Patent Application No. 201820706216.3, filed with the Chinese Patent Office on May 11, 2018, to Chinese Patent Application No. 201810453312.6, filed with the Chinese Patent Office on May 14, 2018, and to Chinese Patent Application No. 201810456852. X, filed with the Chinese Patent Office on May 14, 2018, the content of each of which is hereby incorporated by reference in its entirety.

TECHNICAL FIELD

The present disclosure relates to the field of display technologies, and more particularly relates to a display screen and a manufacturing method of a display screen.

BACKGROUND

Thin film packaging technology is particularly suitable for some special applications that are not possible with conventional capping packages, such as packaging for flexible organic light-emitting diodes (OLEDs) and flexible organic solar cells, etc. However, in a process of cutting a display screen body and a display screen after being thin film packaged, it is easy to cause cracks and peeling of the thin film package structure and the screen body, and damage the thin film package structure, so that water and oxygen are easily invaded, and reliability of the thin film package is affected.

SUMMARY

Accordingly, in view of the problem of how to improve the reliability of the thin film package, it is necessary to provide a display screen and a manufacturing method of a display screen, which are capable of improving the reliability of the thin film package.

A display screen is provided in the present disclosure, which includes a package component, an effective package area adjacent to the packaged component, and a package shadow area located at a periphery of the effective package area; the package shadow area including a supporting substrate, the supporting substrate defining at least a groove for disconnecting a thin film package structure; where the thin film package structure is formed on the supporting substrate, and the thin film package structure is broken at the groove.

In an embodiment, the at least a groove includes two grooves, and the two grooves are arranged in parallel.

In an embodiment, opening widths of the two grooves are same, and a ratio of the opening width of each groove, to a distance between the two grooves, to a width of the package shadow area is 0.8~1.2:0.8~1.2:2.5~3.5.

In an embodiment, the distance between the two grooves ranges from 50 μm to 60 μm, depths of the grooves in the supporting substrate range from 4 μm to 8 μm, and the opening widths of the grooves range from 50 μm to 60 μm.

In an embodiment, a cross-sectional shape of the groove along a direction perpendicular to a surface of the supporting substrate is a trapezoidal shape, and an inner angle of the trapezoid is greater than 45° and less than 90°.

According to the display screen of the technical solution of the present disclosure, since the thin film package structure can be disconnected at the groove, a transmission path of laser heat radiation and stress when cutting the display screen body can be cut off, and cracks are effectively prevented from being generated on the thin film package structure, so that reliability of the thin film package can be improved, and an application thereof is facilitated.

In addition, since an influence of the laser heat radiation and stress on the thin film package structure during cutting is reduced, an influence of shadow effect during thin film packaging is not required to be considered in a design of a frame, and a design margin of the frame is increased. It is easy to achieve a narrow frame.

In an embodiment, the thin film package structure includes a plurality of film layers sealed outside of the packaged component, the plurality of film layers has a non-display area; the plurality of film layers include:
 at least one organic thin film layer;
 at least one inorganic thin film layer stacked with the organic thin film layer; and
 a third thin film layer located in the non-display area, where the third thin film layer is formed on the plurality of film layers and covers a first end of the plurality of film layers, the first end being located at a side opposite to another side where the packaged component is located.

In an embodiment, a thickness of the third thin film layer ranges 0.5 μm to 6 μm, and/or a width of the third thin film layer ranges from 0.02 mm to 1.2 mm.

In an embodiment, the display screen further includes: an array substrate, the packaged component being disposed on the array substrate, where the array substrate includes a first dam portion to block flowable organic material when forming the organic thin film layer of the thin film package structure, and the third thin film layer is located at a side of the first dam portion opposite to another side where the packaged component is located.

In an embodiment, the array substrate further includes a second dam portion to block the flowable organic material when forming the organic thin layer of the thin film package structure, and the first dam portion and the second dam portion are sequentially disposed along a direction toward the packaged component.

In an embodiment, the third thin film layer is further filled between the first dam portion and the second dam portion, and a thickness of the thin film package structure at a position corresponding to the first dam portion is equal to a thickness of the thin film package structure at a position corresponding to the third thin film layer.

According to the display screen of the technical solution of the present disclosure, during the process of cutting the thin film packaged display screen body, the cutting heat radiation and stress can be dispersed and transmitted to the third thin film layer, thereby reducing damage to the plurality of film layers in the thin film package structure caused by transmission of the cutting heat radiation and the stress, which can improve the reliability of the thin film package and facilitate the application thereof.

In an embodiment, the display screen defines a notch, the display screen includes a display area, and the notch is located at an outside of the display area. The display screen further includes a heat-insulating film layer. The thin film package structure at least covers the display area. The heat-insulating film layer is disposed on the display screen including the thin film package structure and is located adjacent to the notch.

In an embodiment, the heat-insulating film layer is directly disposed on an upper surface of the thin film package structure. The notch and the display area have a package reservation area provided therebetween. The thin film package structure covers the package reservation area, and the heat-insulation film layer covers the thin film package structure located within the package reservation area.

In an embodiment, the heat-insulating film layer and the thin film package structure within the package reservation area are both of stepped configurations. The stepped configurations are disposed along a direction from the display area to the notch.

In an embodiment, the package reservation area further includes a TFT (Thin Film Transistor) array substrate, and the heat-insulation film layer within the package reservation area extends from the display area to the TFT array substrate located at the notch.

In an embodiment, the thin film package structure is in direct contact with the TFT array substrate within the package reservation area.

In an embodiment, the TFT array substrate within the package reservation area is provided with a gap at a position adjacent to the notch, and the thin film package structure covers the TFT array substrate and fill the gap.

In an embodiment, the gap is provided on a thin film transistor layer on the TFT array substrate.

According to the display screen of the present disclosure, since the heat-insulating film layer is disposed on the display screen at a position adjacent to the notch, during a process of laser cutting to form the notch, the heat-insulating film layer can prevent heat of the laser from transferring to the display area, thereby reducing damage to pixels in the display area caused by the heat of the laser cutting, and avoiding package failure problem resulting therefrom, so that damage to membrane and the substrate can be avoided, and reliability of the package and production yield of the display screen can be improved.

A manufacturing method of a display screen is further provided in the present disclosure, which includes: providing a supporting substrate base having a non-display area, the non-display area including an effective package area adjacent to a packaged component, and a package shadow area located at a periphery of the effective package area; forming a groove in the package shadow area of the supporting substrate base for disconnecting a thin film package structure, to obtain a supporting substrate; forming a film layer structure on the supporting substrate and then removing the film layer structure in the package shadow area to expose the groove, to obtain an array substrate; and forming the thin film package structure on the array substrate, and disconnecting the thin film package structure at the groove, to obtain a display screen.

In an embodiment, the step of forming a groove in the supporting substrate base for disconnecting a thin film package structure includes: exposing and developing the supporting substrate base to define the groove on the supporting substrate base for disconnecting the thin film package structure. The step of removing the film layer structure in the package shadow area includes removing the film layer structure in the package shadow area by photolithography.

In an embodiment, the display screen includes a display area and a notched area located at an outside of the display area; the manufacturing method further includes: covering the display area with the thin film package structure; disposing a heat-insulating layer on the display screen includ-ing the thin film package structure at a position adjacent to the notched area; and forming the groove in the notched area.

According to the manufacturing method of the display screen of the present disclosure, a groove for disconnecting the thin film package structure is defined in the package shadow area of the supporting substrate base, which is not merely simple in process, but also can cut off a transmission path of laser heat radiation and stress during cutting the display screen body so as to effectively avoid cracks in the thin film package structure, thereby improving the reliability of the thin film package and facilitating application.

DETAILED DESCRIPTION OF THE EMBODIMENTS

The above objects, features and advantages of the present disclosure will become more apparent by describing in detail embodiments thereof with reference to the accompanying drawings. Though the embodiments will be particularly described in details below, they may merely represent several modes of implementation, and cannot be construed as limiting the scope of the present application. It should be understood by those skilled in the art that a plurality of modification and improvement may be made therein without departing from the spirit of the present application. Therefore, the scope of protection of the present application shall be subject to the specific embodiments.

Figure 1:
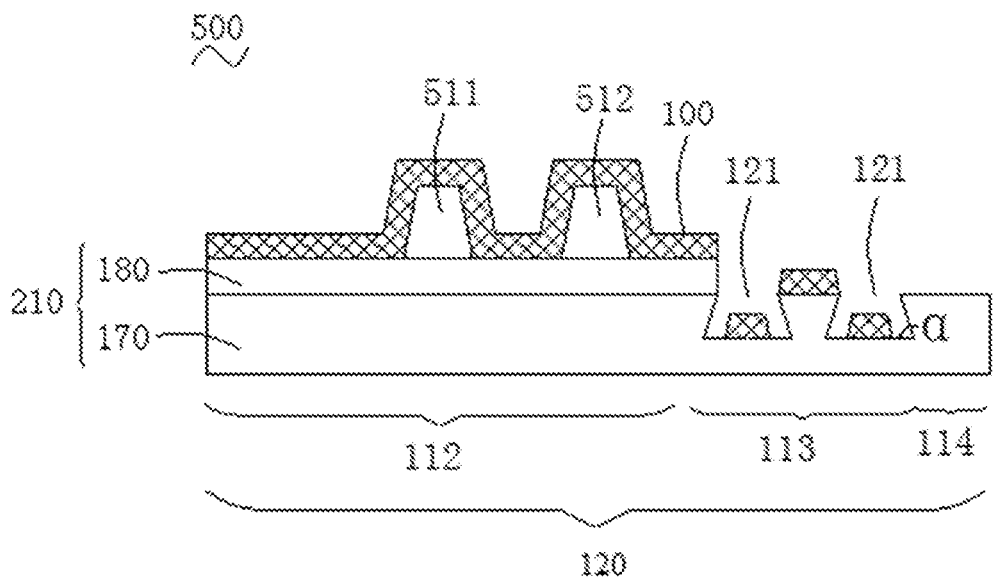
FIG. 1 is a schematic diagram of a display screen in accordance with an embodiment of the present disclosure.

Referring to FIG. 1, a display screen 500 is provided according to an embodiment. The display screen 500 includes a non-display area 120. The non-display area 120 includes an effective package area 112 adjacent to a packaged component, and a package shadow area 113 located at a periphery of the effective package area 112. In addition, the non-display area 120 further includes a cutting reservation area 114 located at a periphery of the package shadow area 113.

The effective package area 112 refers to a package area that has a size same to that of an opening of a mask sheet. The package shadow area 113 refers to an extra area of package material produced since the package material actually deposited onto a supporting substrate 170 is more than an area of the opening of the mask sheet due to the shadow effect. The cutting reservation area 114 refers to an area between an outer edge of the package shadow area 113 and a cutting line of a screen body.

In addition, it should be noted that the display 500 further includes a display area (not shown), and the non-display area 120 located at a periphery of the display area.

The package shadow area 113 includes the supporting substrate 170 and a thin film package structure 100. The supporting substrate 170 defines a groove 121 for disconnecting the thin film package structure 100. Specifically, the thin film package structure 100 is formed on the supporting substrate 170, and the thin film package structure 100 can be disconnected at the groove 121. Since the thin film package structure 100 can be disconnected at the groove 121, a transmission path of laser heat radiation and stress during cutting the display body can be cut off, thereby effectively preventing cracks from being generated on the thin film package structure 100 of the effective package area 112, so as to improve reliability of a thin film package.

It should be noted that, in FIG. 1, it shows merely an inorganic thin film layer of the thin film package structure 100 adjacent to an array substrate 210, but it should be understood that it does not exclude the thin film package structure 100 to further include other film layers. For example, the thin film package structure 100 includes at least one inorganic thin film layer and at least one organic thin film layer stacked with each other. Preferably, the organic film layer is sandwiched between two inorganic film layers.

Further, as shown in FIG. 1, the effective package area 112 includes the array substrate 210 and the thin film package structure 100 formed on the array substrate 210. The array substrate 210 includes the supporting substrate 170 and a film layer structure 180 formed on the supporting substrate 170. The film layer structure 180 is the remaining film layers of the array substrate 210 except the supporting substrate 170. For example, it can be a barrier layer (BL), a buffer layer, an insulating interlayer, etc. In addition, the film layer structure 180 can further include a first dam portion 511 and a second dam portion 512, for blocking flowable organic material during forming the organic thin film layer 100 of the thin film package structure.

In addition, the display screen 500 further includes a packaged component (not shown) disposed on the array substrate 210. The packaged component is located in the display area. The packaged component is sealed on the array substrate 210 via the thin film package structure 100.

On the basis of the aforementioned embodiments, the number of the groove 121 is two, and the two grooves 121 are arranged in parallel. It enables the thin film package structure 100 be disconnected at the two grooves 121, which effectively cuts off the transmission path of laser heat radiation and stress during cutting the display body and presents cracks from being generated on the thin film package structure 100, thereby improving the reliability of the thin film package.

On the basis of the aforementioned embodiments, opening widths of the two grooves 121 are same. A ratio of the opening width of each groove 121, to a distance between the two grooves 121, to a width of the package shadow area 113 is 0.8~1.2:0.8~1.2:2.5~3.5. More preferably, the ratio of the opening width of each groove 121, to the distance between the two grooves 121, to the width of the package shadow area 113 is 1:1:3. It can ensure that the width of the groove 121 and the distance between the two grooves 121 are same, which can simplify a patterning process of manufacturing the groove 121.

Preferably, the distance between the two grooves 121 ranges from 50 μm to 60 μm. It can ensure that the thin film package structure is disconnected at the two grooves 121.

On the basis of the aforementioned embodiments, a depth of the groove 121 in the supporting substrate 170 ranges from 4 μm to 8 μm. Since the depth of the groove 121 in the supporting substrate 170 ranges from 4 μm to 8 μm, it ensures a sufficient opening depth to disconnect the thin film package structure at the groove 121, and further ensures that the pattern at an array segment is etched sufficiently to obtain a desired pattern, thereby preventing material of the array segment from being left in the groove 121.

On the basis of the aforementioned embodiments, the opening width of the groove 121 ranges from 50 μm to 60 μm. Since the opening width of the groove 121 ranges from 50 μm to 60 μm, it ensures a sufficient opening width to disconnect the thin film package structure at the groove 121, and further ensures that the pattern of the array segment is sufficiently exposed and developed to obtain the desired pattern, thereby preventing material of the array segment from being left in the groove 121.

On the basis of the aforementioned embodiments, a cross-sectional shape of the groove 121 along a direction perpendicular to a surface of the supporting substrate 170 is trapezoidal, rectangular, or semi-circular. Opening angles of these patterns are relatively large, and film covering property is poor, which helps disconnect the thin film package structure at the groove 121.

The number of the grooves 121, the distance between the two grooves 121, the depth of the groove 121 in the supporting substrate 170, the opening width of the groove 121, and the cross-sectional shape of the groove 121 along the direction perpendicular to the surface of the supporting substrate 170 are not limited thereto.

On the basis of the aforementioned embodiments, the cross-sectional shape of the groove 121 along the direction perpendicular to the surface of the supporting substrate 170 is trapezoidal, and an inner angle α of the trapezoid is greater than 45°, and less than 90°. The probability of the thin film package structure 100 to be completely disconnected at the groove 121 is increased, so as to effectively cut off the transmission path of the laser heat radiation and stress during cutting the display screen body.

According to the display screen of the technical solution of the present disclosure, since the thin film package structure can be disconnected at the groove, the transmission path of laser heat radiation and stress during cutting the display screen body can be cut off, and cracks are effectively prevented from being generated on the thin film package structure, so that reliability of the thin film package can be improved, and an application thereof is facilitated.

In addition, since an influence of the laser heat radiation and stress on the thin film package structure during cutting is reduced, an influence of shadow effect during thin film packaging is not required to be considered in a design of a frame, and a design margin of the frame is increased. It is easy to achieve a narrow frame.

Figure 2:
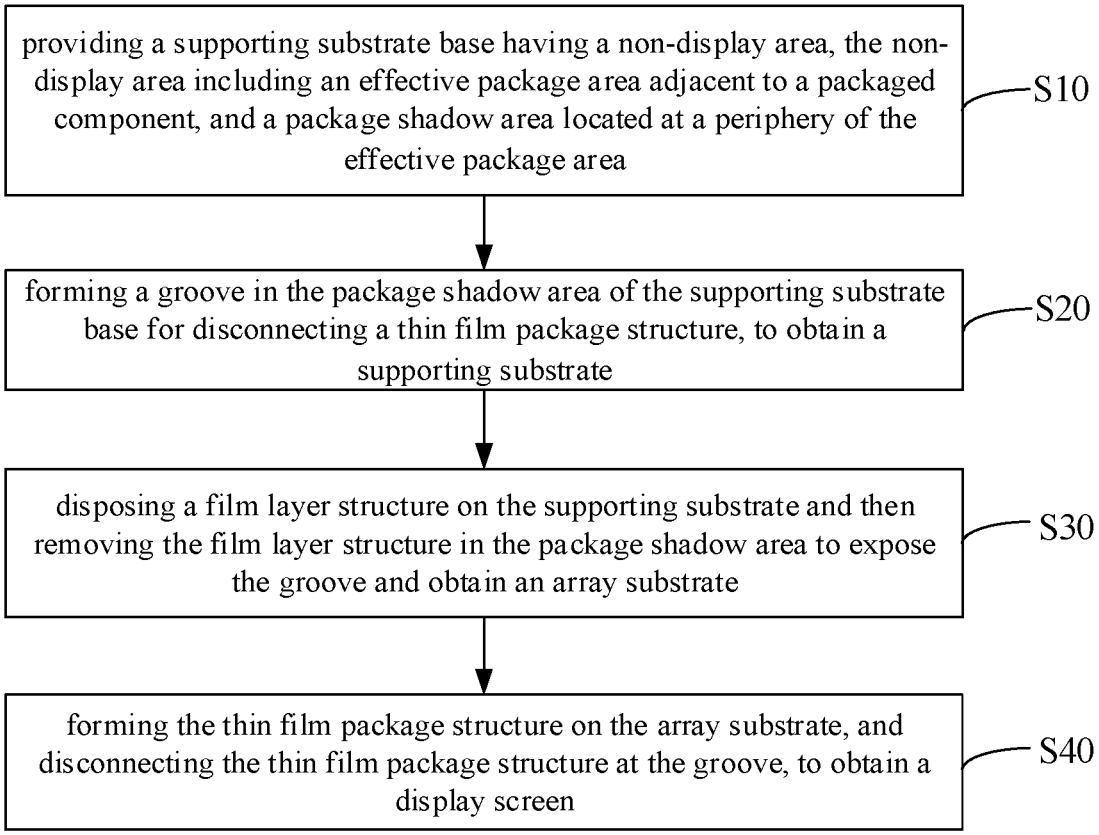
FIG. 2 is a flowchart of a manufacturing method of a display screen in accordance with an embodiment of the present disclosure.

Referring to FIG. 2, a manufacturing method of a display screen according to an embodiment of the present disclosure includes following steps.

In S10, a supporting substrate base is provided, the supporting substrate base has a non-display area, the non-display area includes an effective package area adjacent to a packaged component, and a package shadow area located at a periphery of the effective package area.

Figure 3:
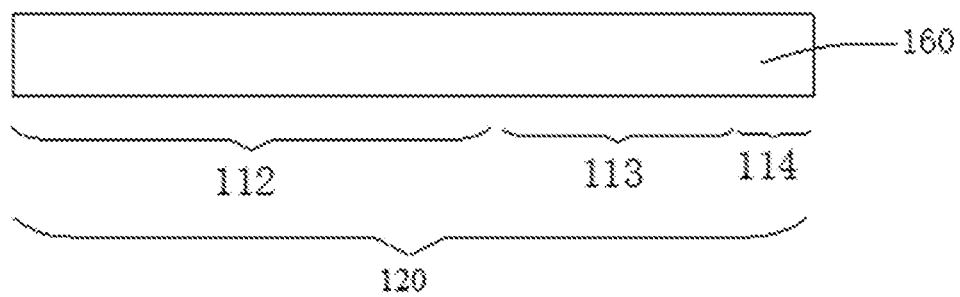
FIG. 3 is a schematic diagram of a supporting substrate base in accordance with an embodiment of the present disclosure.

Further referring to FIG. 3, the supporting substrate base 160 includes a non-display area 120 and a display area (not shown). The non-display area 120 includes a package area and a cutting reservation area 114 located at a periphery of the package area. The package area includes an effective package area 112 adjacent to a packaged component, and a package shadow area 113 located at a periphery of the effective package area 112.

The effective package area 112 refers to a package area that has a size same to that of an opening of a mask sheet. The package shadow area 113 refers to an extra area of package material produced since the package material actually deposited onto a supporting substrate 170 is more than an area of the opening of the mask sheet due to the shadow effect. The cutting reservation area 114 refers to an area between an outer edge of the package shadow area 113 and a cutting line of a screen body.

The supporting substrate base 160 supports a film layer structure of upper layers. The supporting substrate base 160 is preferably a flexible substrate, such as a polyimide (PI) substrate.

In S20, a groove for disconnecting a thin film package structure is formed in the package shadow area of the supporting substrate base to obtain a supporting substrate.

Preferably, the step of forming a groove 121 in the supporting substrate base 160 for disconnecting the thin film package structure includes: exposing and developing the supporting substrate base 160 to form the groove 121 on the supporting substrate base 160 for disconnecting the thin film package structure.

The supporting substrate base 160 is preferably a PI (polyimide) substrate. Since PI is an organic glue, the supporting substrate base 160 is merely exposed and developed to form the groove 121 on the supporting substrate base 160 for disconnecting the thin film package structure without being etched.

Figure 4:
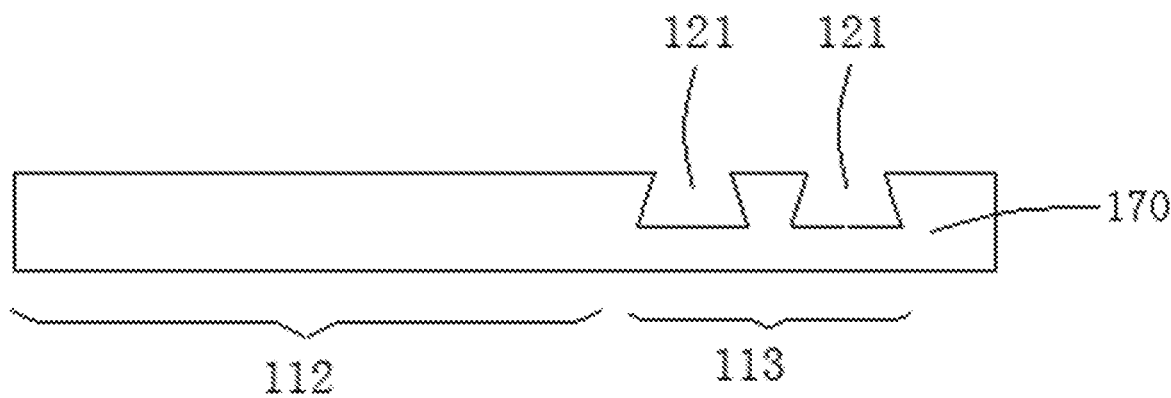
FIG. 4 is a schematic diagram of a supporting substrate in accordance with an embodiment of the present disclosure.

Further referring to FIG. 4, in the supporting substrate 170 of the present embodiment, a cross-sectional shape of the groove 121 along a direction perpendicular to a surface of the supporting substrate 170 is a trapezoid. The number of the grooves 121 is two. The cross-sectional shape of the groove 121 along the direction perpendicular to the surface of the supporting substrate 170 and the number of the grooves 121 are not limited thereto.

In S30, a film layer structure is formed on the supporting substrate, and then the film layer structure located in the package shadow area is removed to expose the groove, to obtain an array substrate 210.

Figure 5:
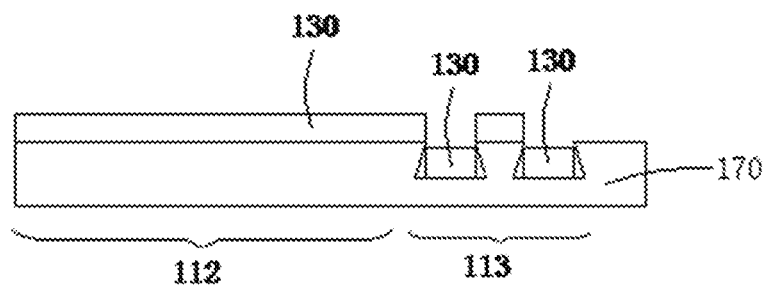
FIG. 5 is a schematic diagram illustrating that a film layer structure is formed on the supporting substrate in accordance with an embodiment of the present disclosure.

Further referring to FIG. 5, a film layer structure 180 can be formed on the supporting substrate 170 via evaporation. The film layer structure 180 is remaining film layers of the array substrate 210. For example, it can be a barrier layer (BL), a buffer layer, an insulating interlayer, etc. Because of the groove 121, a portion of the film layer structure 180 falls into the groove 121.

In addition, the film layer structure 180 can further include a first dam portion 131 and a second dam portion 132 for blocking flowable organic material during forming an organic film layer of the thin film package structure.

Figure 6:
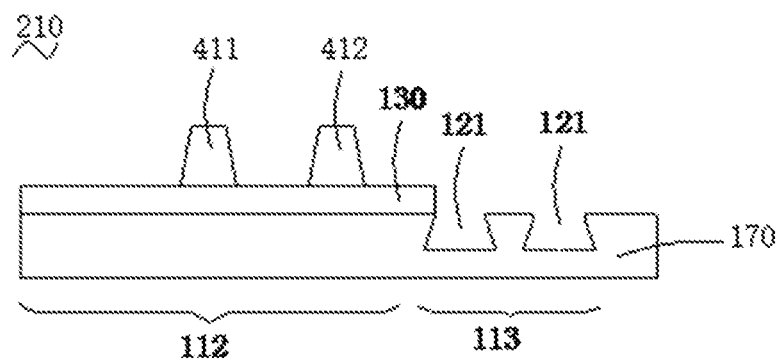
FIG. 6 is a schematic diagram of an array substrate in accordance with an embodiment of the present disclosure.

Further referring to FIG. 6, in the array substrate 210 obtained after removal of the film layer structure 180 in the package shadow area 113, the film layer structure 180 extends on the supporting substrate 170 to an intersection position of the effective package area 112 and the package shadow area 113.

Preferably, the step of removing the film layer structure 180 in the package shadow area 113 includes removing the film layer structure 180 in the package shadow area 113 by photolithography. Specifically, a photoresist layer is firstly coated on the entire film layer structure 180, and then the film layer structure 180 is sequentially coated with a photoresist, exposed, developed, and etched to remove the film layer structure 180 in the package shadow area 113.

In S40, the thin film package structure is formed on the array substrate, and the thin film package structure is disconnected at the groove 121 to obtain a display screen.

Further referring to FIG. 1, in the display screen 500, after the thin film package structure 100 is formed on the array substrate 210, the thin film package structure 100 can be disconnected at the groove 121. Therefore, the transmission path of laser heat radiation and stress during cutting the display screen body is cut off, which effectively prevents cracks from being generated in the thin film package structure, thereby improving the reliability of the film package and facilitating an application thereof.

It should be noted that the supporting substrate base 160 has a non-display area 120 and a display area (not shown) same to those of the display screen 500. The non-display area 120 of the display screen 500 also includes a package area and a cutting reservation area 114 located at the periphery of the package area. The package area includes an effective package area 112 adjacent to the packaged component, and a package shadow area 113 located at the periphery of the effective package area 112.

According to the manufacturing method of a display screen of the technical solution of the present disclosure, the groove for disconnecting the thin film package structure is formed in the package shadow area of the supporting substrate base, which not merely simplifies the process, but also enables to cut off transmission path of laser heat radiation and stress during cutting the display screen body, thereby effectively preventing cracks from being generated in the thin film package structure, so as to improve the reliability of the thin film package and facilitate the application thereof.

Figure 7:
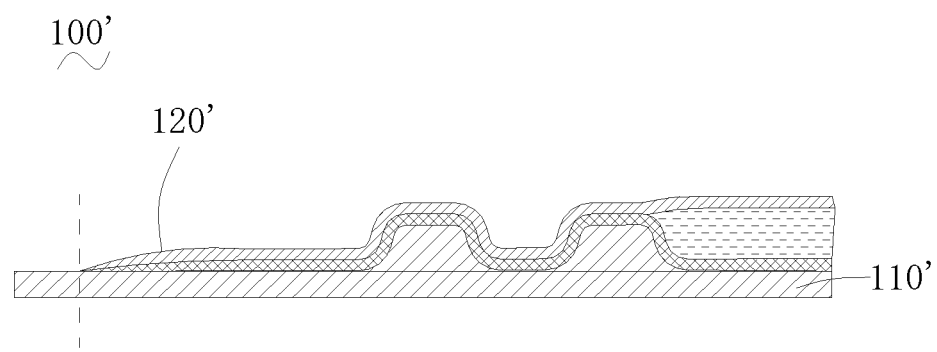
FIG. 7 is a schematic diagram of a display screen.

Referring to FIG. 7, a display screen 100' includes an array substrate 110', a packaged component (not shown) disposed on the array substrate 110', and a thin film package structure 120' for sealing the packaged component (not shown) on the array substrate 110'. During a cutting process of the thin film packaged display screen body, for example, during cutting along the dotted line in FIG. 1, the cutting heat radiation and stress is easily transferred from an edge of the thin film package structure 120' to an interior thereof, which may easily damage the thin film package structure 120' and affect the reliability of the thin film package.

The thin film package structure of the present disclosure includes a plurality of film layers sealed on an outside of the packaged component. The plurality of film layers have a non-display area. The plurality of film layers include at least one organic thin film layer and at least one inorganic thin film layer, and the inorganic film layer and the organic thin film layer are stacked with each other. The thin film package structure further includes a third thin film layer located in the non-display area. The third thin film layer is formed on the plurality of film layers and covers a first end of the plurality of film layers. The first end located at a side opposite to another side where the packaged component is located.

During the cutting process of the thin film packaged display screen body (including screen body cutting and notch area cutting), the cutting heat radiation and stress can be dispersed and transferred to the third thin film layer. It reduces damage to multiple layers in the thin film package structure caused by the transmission of the cutting heat radiation and stress and can improve the reliability of the thin film package.

Figure 8:
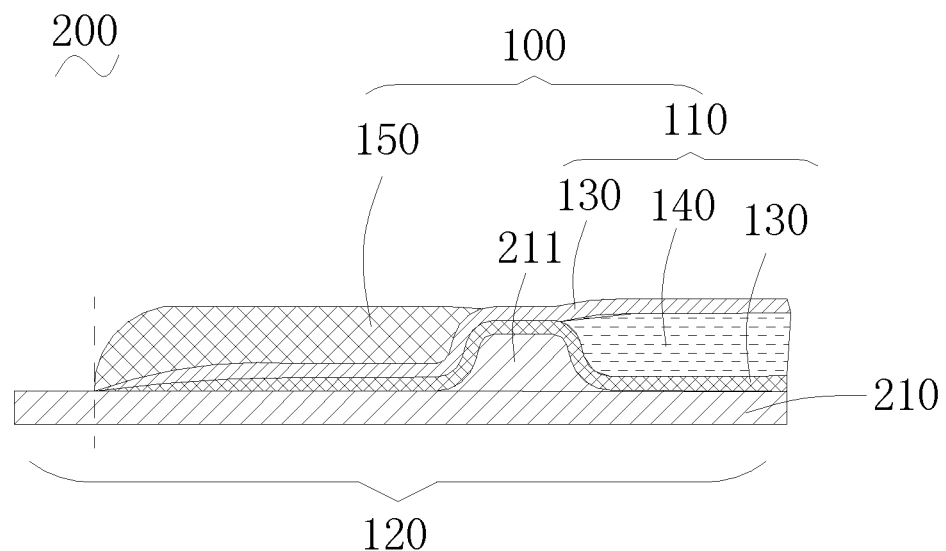
FIG. 8 is a schematic diagram of a thin film package structure and a display screen in accordance with an embodiment of the present disclosure.

Referring to FIG. 8, the thin film package structure 100 according to an embodiment of the present disclosure includes a plurality of film layers 110 for sealing on an outside of the packaged component. The packaged component is located at a right side in FIG. 8. The plurality of film layers 110 have a non-display area 120. The plurality of film layers 110 include at least one inorganic thin film layer 130 (the number of which in FIG. 2 is two) and at least one organic thin film layer 140 between the inorganic thin film layers 130 in the longitudinal direction (e.g. thickness direction, the up and down direction in FIG. 8).

In addition, the thin film package structure 100 further includes a third thin film layer 150 located in the non-display area 120. The third thin film layer 150 is formed on the plurality of film layers 110 and covers a first end of the plurality of film layers 110 located at a side opposite to another side where the packaged component is located.

The non-display area 120 is a non-display area of the display screen. The plurality of film layers 110 also have a display area (not shown), that is, a display area of the display screen. The non-display area 120 is located at a periphery of the display area.

In the aforementioned thin film package structure 100, the third thin film layer 150 is independent of the underlying plurality of film layers 110, and an interface between the third thin film layer 150 and the plurality of film layers 110 provides a good barrier function. When the cutting heat radiation and stress are transferred to the third thin film layer 150, it is possible to prevent the cutting heat radiation and stress from continuing to be transferred downward into the underlying plurality of film layers 110.

On the basis of the afore-described embodiments, a thickness of the third thin film layer 150 ranges from 0.5 μm to 6 μm. Since the thickness of the third thin film layer 150 ranges from 0.5 μm to 6 μm, the transmission of the cutting heat radiation and stress can be effectively dispersed in the longitudinal direction, thereby effectively reducing the damage to the plurality of film layers in the thin film package structure 100 caused by of the transmission of the cutting heat radiation and stress.

On the basis of the afore-described embodiments, a width of the third thin film layer 150 ranges from 0.02 mm to 1.2 mm. Since the width of the third thin film layer 150 ranges from 0.02 mm to 1.2 mm, a transmission path of the cutting heat radiation and stress in the third thin film layer 150 is long enough to disperse most of the cutting heat radiation and stress in a lateral direction (a width direction, that is, a left-right direction in FIG. 8).

More preferably, the width of the third thin film layer 150 ranges from 0.1 mm to 0.4 mm, which can not only ensure that the cutting heat radiation and stress has a sufficiently long lateral transmission path within the third thin film layer 150, but also help being applied on a narrow frame product.

More preferably, when the thickness of the third thin film layer 150 ranges from 0.5 μm to 6 μm, and the width of the third thin film layer 150 ranges from 0.02 mm to 1.2 mm, the cutting heat radiation and stress of a relatively large range in the longitudinal direction and in the lateral direction can be dispersed simultaneously via the third thin film layer 150, thereby effectively improving an effect of the thin film package.

The thickness and width of the third thin film layer 150 are not limited thereto.

On the basis of the afore-described embodiments, the third thin film layer 150 is an aluminum oxide thin film layer, a silicon nitride thin film layer, or an aluminum nitride thin film layer. The transmission speed of the cutting heat radiation and stress in the third thin film layer 150 of these materials is faster, thereby effectively dispersing most of the cutting heat radiation and stress. In addition, the third thin film layer 150 of these materials can also perform as a barrier to external water and oxygen. The material of the third thin film layer 150 is not limited thereto.

It should be noted that in the thin film package structure of the afore-described embodiments, the number of layers of the third thin film layer 150 is one. The number of layers of the third thin film layer 150 is not limited thereto, and can include two or more stacked sub-layers.

In addition, the third thin film layer 150 in the afore-described embodiments covers the end of the plurality of film layers 110 away from the packaged component. However, the third thin film layer 150 can further extend outward, as long as the third thin film layer 150 covers the end of the plurality of film layers 110 at the side opposite to another side where the packaged component is located.

According to the thin film package structure, during the process of cutting the thin film packaged display screen body, the cutting heat radiation and stress can be dispersed and transferred to the third thin film layer. It reduces damage to the plurality of film layers in the film package structure caused by the transmission of the cutting heat radiation and the stress, improves the reliability of the thin film package, and facilitates the application thereof.

Since the thin film package structure of the technical solution of the present disclosure can improve the reliability of the thin film package, it is suitable for being applied on a narrow frame product.

Referring to FIG. 8, a display screen 200 according to an embodiment of the present disclosure includes an array substrate 210, a packaged component (not shown), and the thin film package structure 100 of the afore-described embodiments.

The packaged component is disposed on the array substrate 210. The packaged component is sealed on the array substrate 210 via the thin film package structure 100. The packaged component can be a display component such as a flexible organic light emitting diode (OLED) and the like.

On the basis of the afore-described embodiments, the array substrate 210 includes a first dam portion 211 for blocking the flowable organic material when forming the organic thin film layer 140 of the thin film package structure 100. The third thin film layer 150 is located on a side of the first dam portion 211 opposite to another side where the packaged component is located. As shown in FIG. 8, a coverage of the third thin film layer 150 is large, so that the third thin film layer 150 can effectively disperse the cutting heat radiation and stress.

The array substrate of the present disclosure is not limited thereto, and the number of dam portions for blocking the flowable organic material when forming the organic thin film layer of the thin film package structure can be two or more.

Figure 9:
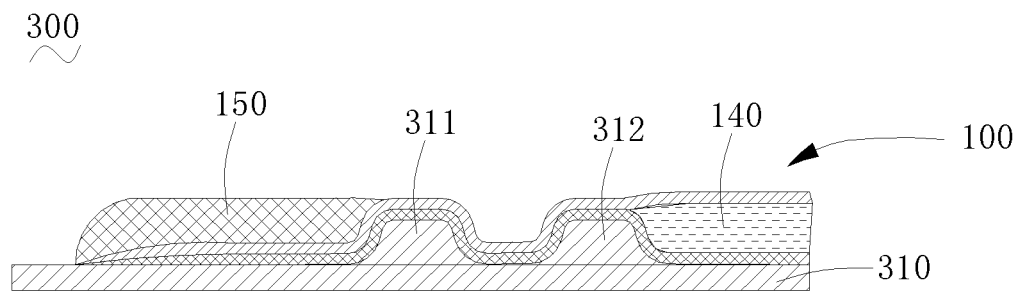
FIG. 9 is a schematic diagram of a display screen in accordance with an embodiment of the present disclosure.

Referring to FIG. 9, in a display screen 300 of another embodiment, an array substrate 310 includes a first dam portion 311 and a second dam portion 312, for blocking the flowable organic material when forming the organic thin film layer 140 of the thin film package structure 100. The first dam portion 311 and the second dam portion 312 are sequentially provided in a direction toward the packaged component.

In the present embodiment, the third thin film layer 150 is located at a side of the first dam portion 311 opposite to another side where the packaged component is located, and a coverage of the third thin film layer 150 is large, so that the third thin film layer 150 can effectively disperse the cutting heat radiation and stress.

On the basis of the afore-described embodiment, the thickness of the thin film package structure 100 at the position corresponding to the first dam portion 311 is substantially equal to the thickness of the thin film package structure 100 at the position corresponding to the third thin film layer 150. It would prevent an edge of the display screen 300 from warping.

Figure 10:
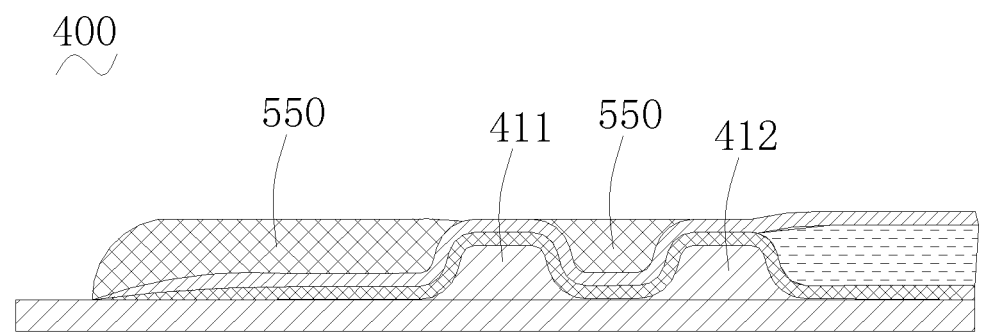
FIG. 10 is a schematic diagram of a display screen in accordance with an embodiment of the present disclosure.

Referring to FIG. 10, in the display screen 400 of another embodiment, the third thin film layer 550 is located on the side of the first dam portion 411 opposite to another side where the packaged component is located, and the third thin film layer 550 is further filled between the first dam portion 411 and the second dam portion 412. It facilitates flattening of position between the first dam portion 411 and the second dam portion 412, to avoid poor bonding when a polarizer is subsequently bonded.

According to the display screen of the technical solution of the present disclosure, during the process of cutting the thin film packaged display screen body, the cutting heat radiation and stress can be dispersed and transferred to the third thin film layer. It reduces damage to the plurality of film layers of the thin film package structure caused by the transmission of the cutting heat radiation and stress, improves the reliability of the thin film package, and facilitates the application thereof.

Figure 11:
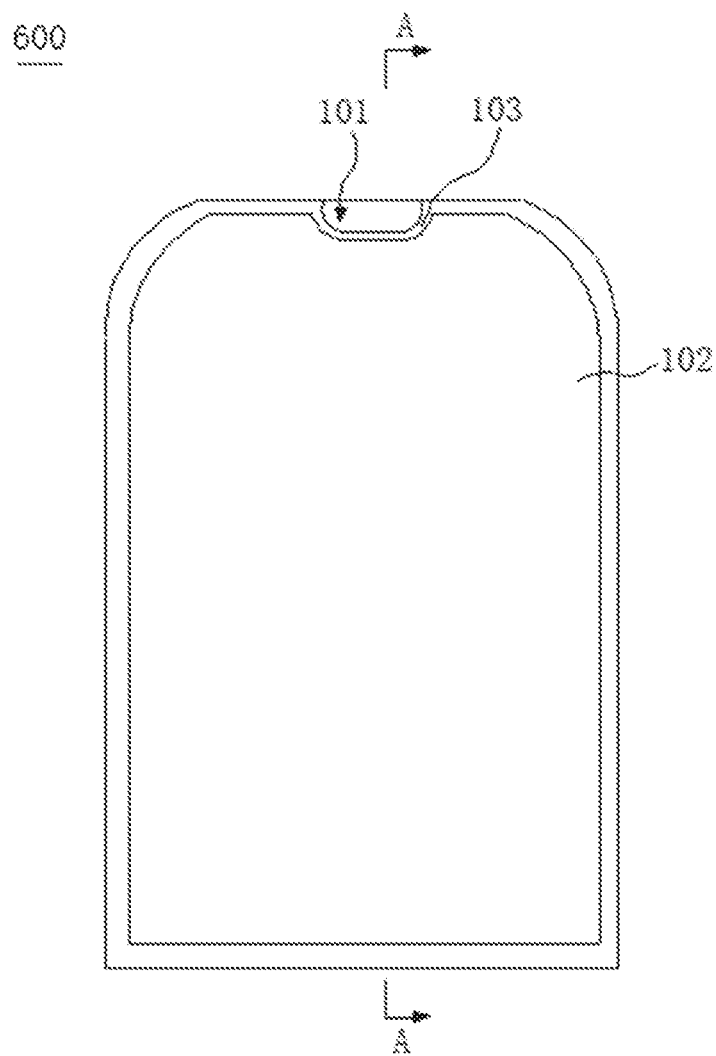
FIG. 11 is a schematic diagram illustrating a structure of the display screen in accordance with an embodiment of the present disclosure.

Referring to FIG. 11, in a display screen 600 according to an embodiment, the display screen 600 defines a notch 101. The notch 101 is used to mount hardware such as facial identification, front cameras, sensors, speakers, and the like. Specifically, the notch 101 is generally formed in a laser cutting process after packaging, and an area corresponding to the notch 101 before the opening of the notch 101 is cut is a notched area 1011 (referring to FIG. 12).

The display screen 600 includes a display area 102, and the notch 101 is defined at an outside of the display area 102.

Figure 12:
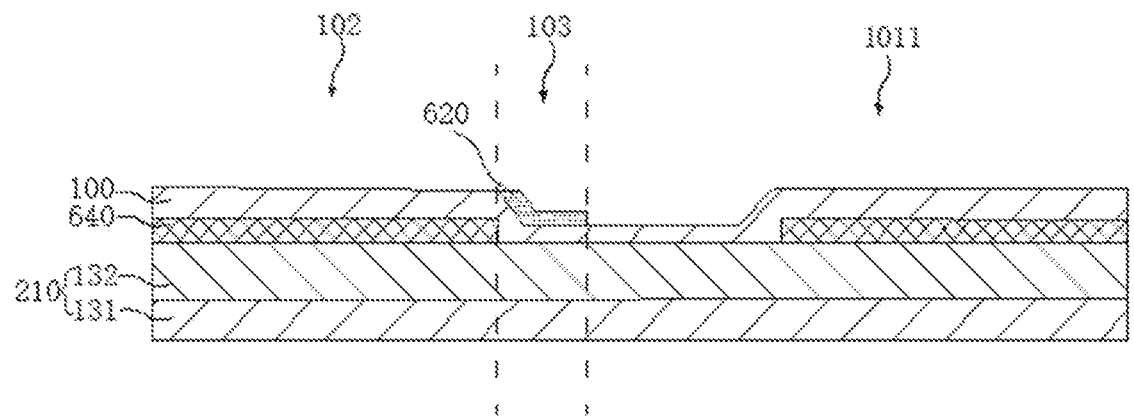
FIG. 12 is a cross-sectional view illustrating a notched area of the display screen in FIG. 11 along A-A line prior to cutting to form a notch in accordance with an embodiment.

Referring to FIG. 12, the display screen 600 further includes the thin film package structure 100 and a heat-insulating film layer 620. The film package structure 100 at least covers the display area 102.

The heat-insulating film layer 620 is disposed on the display screen 600 including the thin film package structure 100, and is disposed adjacent to the notch 101.

Since the heat-insulating film layer 620 is disposed on the display screen 600 and adjacent to the notch 101, the heat-insulating film layer 620 can block heat of laser beam from being transferred to the display area during laser cutting to form the notch 101. It reduces damage to pixels of the display area 102 caused by the heat of the laser cutting, avoids package failure caused thereby, and further avoids damage to the film material and the substrate, thereby improving the reliability of the package and the production yield of the display screen 600.

Further, the heat-insulating film layer 620 is directly disposed on an upper surface of the film package structure 100, and is disposed adjacent to the notch 101.

Since the display screen 600 is provided with the heat-insulating film layer 620 on the upper surface of the film package structure 100 adjacent to the notch 101, the heat-insulating layer 620 can block the heat of the laser beam from being transferred to the thin film package structure 100 and the display area 102 during the laser cutting to form the notch 101. It reduces the damage to the thin film package structure 100 and the pixels of the display area 102 caused by the heat of the laser cutting, avoids the problem of package failure, and further avoids the problem of damage to the film material and the substrate, thereby improving the reliability of the package and the production yield of the display screen 600.

It can be understood that in other embodiments, the heat-insulating film layer 620 can be directly disposed on a lower surface of the thin film package structure 100 or be provided inside the thin film package structure 100, and is disposed adjacent to the notch 101. Thus, the heat-insulating film layer 620 can prevent the heat of the laser cutting from being transferred to the display area to a certain extent, thereby improving the reliability of the package and the production yield of the display screen 600 to a certain extent. In addition, the heat-insulating film layer 620 provided inside the thin film package structure 100 can also block damage to the thin film package structure 100 caused by the heat of the laser cutting to a certain extent, thereby improving the reliability of the package and the production yield of the display screen 600.

It can be understood that the thin film package structure 100 includes a first inorganic package layer and a second inorganic layer stacked from bottom to top, and an organic package layer coated between the first inorganic package layer and the second inorganic layer. When the heat-insulating film layer 620 is provided inside the thin film package structure 100, the heat-insulating film layer 620 can be disposed between any two layers, or can be provided in the first inorganic package layer or the second inorganic layer.

Further, the heat-insulating film layer 620 is a thin film formed of a material such as a porous material, a heat reflecting material, or a vacuum heat-insulating material. The porous material utilizes the pores contained in the material itself to achieve heat-insulation, and the porous material can specifically be a foam material or a fiber material. The heat reflective material include gold, silver, nickel, aluminum foil or metallized polyester, polyimide films, and the like, which have a high reflection coefficient to reflect heat out. The vacuum heat-insulating material can be aerogel felt, etc., which utilizes internal vacuum to achieve an effect of heat-insulation via blocking convection.

Further, before the notch 101 is formed, the heat-insulating film layer 620 can be formed via a film forming technique such as an inkjet printing technique. Specifically, the heat-insulating film layer 620 can be formed on the thin film package structure 100 merely adjacent to the notch 101. The heat-insulating film layer 620 can also be formed on the film packaging structure 100 and the notched area 1011, and then the heat-insulating film layer 620 on the laser cutting area can be etched away, so that the laser cutting area absorbs laser energy for cutting. The heat-insulating film layer 620 can also be formed on the thin film package structure 100 of the display area 102. Referring to FIGS. 11-12, in an embodiment, a package reservation area 103 is provided between a wall of the notch 101 and the display area 102. Specifically, the thin film package structure 100 covers the display area 102 and the package reservation area 103, and the heat-insulating film layer 620 covers the thin film package structure 100 located at the package reservation area 103. The heat-insulating film layer 620 is not required to be removed in this case.

It can be understood that the heat-insulating film layer 620 and the laser cutting line can be directly adjacent to each other, or can have a suitable spacing therebetween. It can be understood that the heat-insulating film layer 620 can be merely disposed to cover the film package structure 100 adjacent to the notch 101, can be disposed to cover a wider range of the thin film package structure 100 including the thin film package structure 100 adjacent to the notch 101, for example, the heat-insulating film layer 620 can be disposed to cover all of the thin film package structure 100.

Figure 13:
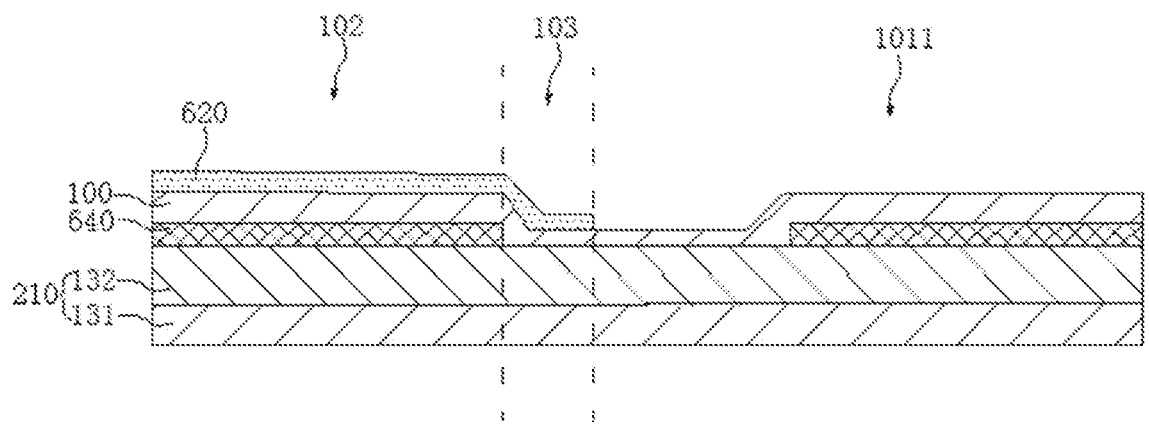
FIG. 13 is a cross-sectional view illustrating a notched area of the display screen in FIG. 11 along A-A line prior to cutting to form a notch in accordance with another embodiment.

Referring to FIG. 13, specifically, in the present embodiment, the heat-insulating film layer 620 is further disposed to cover the thin film package structure 100 in the display area 102.

It can be understood that the heat-insulating film layer 620 can be removed after laser cutting to form the notch 101 when the heat-insulating film layer 620 covers the display area 102. Alternatively, the heat-insulating film layer 620 can be provided as a high light-transmitting thin film, then the heat-insulating thin film layer 620 is not required to be removed. It can be understood that the heat-insulating film layer 620 in the package reservation area 103 is not required to be removed.

Further, the heat-insulating film layer 620 and the thin film package structure 100 in the package reservation area 103 are both provided in a stepped structure. The stepped structure is disposed in a direction from the display area 102 to the notch 101. And the position for the laser cutting is located at a wall of the notch 101, so that the energy of the laser cutting is transferred from the wall of the notch 101 to the display area 102 through the stepped heat-insulating film layer 620 and film package structure 100. On one hand, the heat-insulating film layer 620 blocks the heat conduction of the laser energy to the thin film package structure 100 located in an inner layer, and on the other hand, the blocking effect of the heat-insulating film layer 620 with the stepped structure is greatly improved, and the heat conduction effect of the thin film package structure 100 with the stepped structure is greatly reduced, thereby reducing the damage to the thin film package structure 100 and the pixels of the display area 102 caused by the laser cutting energy in many ways, and further improving the reliability of the package and the production yield of the display screen 600.

Further, the package reservation area 103 further has a TFT (Thin-film Transistor) array substrate 210 provided therein. The heat-insulating film layer 620 in the package reservation area 103 extends from the display area 102 to the TFT array substrate 210 located at the notch 101.

Further, in the package reservation area 103, the thin film package structure 100 is in direct contact with the TFT array substrate 210. It can be understood that an OLED (organic light-emitting diode) component layer 640 is provided on the TFT array substrate 210 within the display area 102, so that the thin film package structure 100 forms a stepped structure within the package reservation area 103 adjacent to the display area 102. Further, the thin film package structure 100 is encapsulated in the OLED component layer 640, such that the thin film package structure 100 covers the display area 102.

Figure 14:
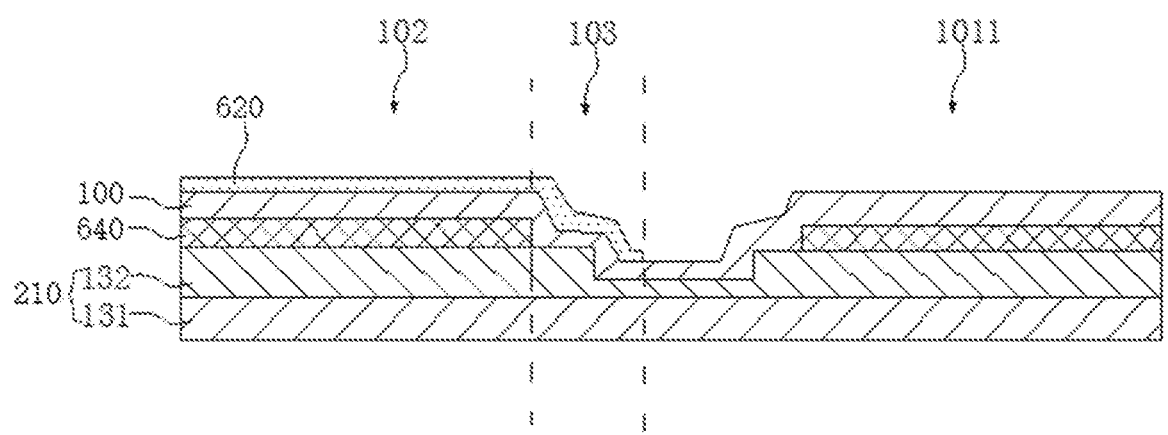
FIG. 14 is a cross-sectional view illustrating a notched area of the display screen in FIG. 11 along A-A line prior to cutting to form a notch in accordance with still another embodiment.

Referring to FIG. 14, further, in another embodiment, a gap (not shown) is provided on an upper surface of the TFT array substrate 210 within the package reservation area 103 and adjacent to the notch 101. The thin film package structure 100 covers the TFT array substrate 210 and fills the gap. Therefore, when the thin film package structure 100 covers the TFT array substrate 210, the stepped structure is formed at the TFT array substrate 210 in direct contact with the thin film package structure 100 and at a position provided with the gap, and accordingly, the stepped structure of the heat-insulating film layer 620 is also formed at this position.

Specifically, in the present embodiment, the gap is provided on the upper surface of the TFT array substrate 210 and adjacent to the notch 101, and an edge of the gap coincides with an edge of the notch 101. When laser cutting to form the notch 101, the cutting starts from the gap along a cutting line to form the aforementioned notch 101. It can be understood that a large gap can be formed at the cutting line between the notched area 1011 and the package reservation area 103 in actual production and manufacture. After forming the thin film package structure 100 and the heat-insulating film layer 620, the aforementioned display screen is obtained by laser cutting along the cutting line.

Further, the TFT array substrate 210 includes a base substrate 131 and a thin film transistor layer 132 disposed on the base substrate 131. The gap is provided on the thin film transistor layer 132 of the TFT array substrate 210.

It can be understood that the gap can extend through the thin film transistor layer 132 such that the thin film package structure 100 is in direct contact with the base substrate 131 at the notch. Alternatively, the gap can be without penetrating the thin film transistor layer 132. Specifically, in this embodiment, the gap is provided on the thin film transistor layer 132 and does not extend through the thin film transistor layer 132.

Referring also to FIGS. 12-14, in an embodiment, the display screen 600 includes a display area 102 and a notched area 1011 located at an outside of the display area 102. The manufacturing method of the display screen according to the present disclosure further includes following steps.

In step S50, the thin film package structure 100 is disposed to cover the display area 102.

In an embodiment, a package reservation area 103 is further provided between the display area 102 and the notched area 1011. A gap is provided on the upper surface of the TFT array substrate 210 within the package reservation area 103 and adjacent to an outer edge thereof. Specifically, the gap is provided on the thin film transistor layer 132 of the TFT array substrate 210.

In step S60, a heat-insulating film layer 620 is formed on the display screen 600 including the thin film package structure 100 at a position adjacent to the notched area 1011.

Further, the insulating film layer 620 is formed on the upper surface of the film package structure 100 and adjacent to the notched area 1011.

In an embodiment, the thin film package structure 100 covers the TFT array substrate 210 within the package reservation area 103. A stepped structure is formed at a junction of direct contact portion of the TFT array substrate 210 with the thin film package structure 100 and a position provided with the gap. Accordingly, the heat-insulating film layer 620 also forms a stepped structure at the junction.

Further, the heat-insulating film layer 620 is formed by film forming technique such as an ink jet printing technique.

In step S70, a notch 101 is defined in the notched area 1011.

In an embodiment, a photosensitive module (not shown) is provided below the notched area 1011.

It can be understood that in other embodiments, the step of removing the heat-insulating film layer 620 is also included when it is required to remove the heat-insulating film layer 620.

In the forgoing manufacturing method, the process thereof is simple. In the process of forming the notch 101 in the notched area 1011 by lase cutting, the heat-insulating film layer 620 can block the heat of the laser from being transferred to the thin film package structure 100 and the display area 102. It reduces damage to the thin film package structure 100 and the pixel of the display area 102 caused by the heat of the laser cutting, avoids the package failure problem, and further avoids the damage problem of the film material and the substrate, thereby improving the reliability of the package and the production yield of the display screen 600.

Technical features of the foregoing embodiments can be randomly combined. For the brevity of description, not all possible combinations of the technical features in the foregoing embodiments are described. However, as long as combinations of these technical features do not contradict each other, it should be considered that the combinations all fall within the scope of this specification.

The foregoing embodiments only describe several implementations of this application, which are described specifically and in detail, and are not intended to be construed as a limitation to the patent scope of the present invention. It should be noted that, persons of ordinary skill in the art can make various changes and improvements without departing from the ideas of this application, which shall all fall within the protection scope of this application. Therefore, the protection scope of this application should be subject to the appended claims.

The invention claimed is:

1. A display screen, comprising:
   a packaged component;
   an effective package area positioned adjacent to the packaged component; and
   a package shadow area, located at a periphery of the effective package area, the package shadow area comprising a supporting substrate defining at least a first groove for disconnecting a thin film package structure;
   wherein the thin film package structure is formed on the supporting substrate, and the thin film package structure is disconnected at the first groove.

2. The display screen according to claim 1, wherein the supporting substrate further defines a second groove, and the first groove and the second groove being arranged in parallel.

3. The display screen according to claim 2, wherein opening widths of the first groove and the second grooves are substantially same, and a ratio of the opening width of each groove, to a distance between the two grooves, to a width of the package shadow area are 0.8~1.2:0.8~1.2:2.5~3.5.

4. The display screen according to claim 2, wherein the distance between the two grooves ranges from 50 μm to 60 μm, depths of the grooves in the supporting substrate range from 4 μm to 8 μm, and the opening widths of the grooves range from 50 μm to 60 μm.

5. The display screen according to claim 1, wherein a cross-sectional shape of the first groove along a direction perpendicular to a surface of the supporting substrate is a trapezoidal shape, and an inner angle of the trapezoid is greater than 45° and less than 90°.

6. The display screen according to claim 1, wherein the thin film package structure comprises a plurality of film layers sealed outside of the packaged component, the plurality of film layers has a non-display area; the plurality of film layers comprises:
   at least one organic thin film layer;
   at least one inorganic thin film layer stacked with the organic thin film layer; and
   a third thin film layer located in the non-display area, the third thin film layer being formed on the plurality of film layers and covers a first end of the plurality of film layers, the first end being located at a side opposite to another side where the packaged component is located.

7. The display screen according to claim 6, wherein a thickness of the third thin film layer ranges 0.5 μm to 6 μm, and/or a width of the third thin film layer ranges from 0.02 mm to 1.2 mm.

8. The display screen according to claim 6, further comprising:
   an array substrate, the packaged component being disposed on the array substrate,
   wherein the array substrate comprises a first dam portion to block flowable organic material when forming the organic thin film layer of the thin film package structure, and the third thin film layer is located at a side of the first dam portion opposite to another side where the packaged component is located.

9. The display panel according to claim 8, wherein the array substrate further comprises a second dam portion to block the flowable organic material when forming the organic thin layer of the thin film package structure, and the first dam portion and the second dam portion are sequentially disposed along a direction toward the packaged component.

10. The display screen according to claim 9, wherein the third thin film layer is further filled between the first dam portion and the second dam portion, and a thickness of the thin film package structure at a position corresponding to the first dam portion is equal to a thickness of the thin film package structure at a position corresponding to the third thin film layer.

11. The display screen according to claim 1, wherein the display screen defines a notch, the display screen includes a display area, and the notch is located at an outside of the display area, the display screen further comprises a heat-insulating film layer, the thin film package structure at least covers the display area, and the heat-insulating film layer is disposed on the display screen including the thin film package structure, and the heat-insulating film layer is located adjacent to the notch.

12. The display screen according to claim 11, wherein the heat-insulating film layer is directly disposed on an upper surface of the thin film package structure, the notch and the display area have a package reservation area provided therebetween, the thin film package structure covers the package reservation area, and the heat-insulation film layer covers the thin film package structure located within the package reservation area.

13. The display screen according to claim 12, wherein the heat-insulating film layer and the thin film package structure within the package reservation area are both of stepped configurations, and the stepped configurations are disposed along a direction from the display area to the notch.

14. The display screen according to claim 13, wherein the package reservation area further comprises a Thin Film Transistor array substrate, and the heat-insulation film layer within the package reservation area extends from the display area to the Thin Film Transistor array substrate located at the notch.

15. The display screen according to claim 14, wherein the thin film package structure is in direct contact with the Thin Film Transistor array substrate within the package reservation area.

16. The display screen according to claim 15, wherein the Thin Film Transistor array substrate within the package reservation area is provided with a gap at a position adjacent to the notch, and the thin film package structure covers the Thin Film Transistor array substrate and fills the gap.

17. The display screen according to claim 16, wherein the gap is provided on a thin film transistor layer on the Thin Film Transistor array substrate.

18. A method of manufacturing display screen comprises:
providing a supporting substrate base having a non-display area, the non-display area comprising an effective package area adjacent to a packaged component, and a package shadow area located at a periphery of the effective package area;
forming a groove in the package shadow area of the supporting substrate base for disconnecting a thin film package structure, to obtain a supporting substrate;
disposing a film layer structure on the supporting substrate and then removing the film layer structure in the package shadow area to expose the groove, to obtain an array substrate; and
forming the thin film package structure on the array substrate, and disconnecting the thin film package structure at the groove, to obtain a display screen.

19. The method according to claim 18, wherein the forming a groove in the supporting substrate base for disconnecting a thin film package structure comprises:
exposing and developing the supporting substrate base to define the groove on the supporting substrate base for disconnecting the thin film package structure; and the removing the film layer structure in the package shadow area comprises removing the film layer structure in the package shadow area by photolithography.

20. The method according to claim 19, wherein the display screen comprises a display area and a notched area located at an outside of the display area;
the manufacturing method further comprises:
covering the display area with the thin film package structure;
disposing a heat-insulating layer on the display screen including the thin film package structure at a position adjacent to the notched area; and
forming a notch in the notched area.

* * * * *